US006429452B1

(12) United States Patent
Jarvis

(10) Patent No.: US 6,429,452 B1
(45) Date of Patent: Aug. 6, 2002

(54) TEST STRUCTURE AND METHODOLOGY FOR CHARACTERIZING ION IMPLANTATION IN AN INTEGRATED CIRCUIT FABRICATION PROCESS

(75) Inventor: Richard W. Jarvis, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/375,455

(22) Filed: Aug. 17, 1999

(51) Int. Cl.⁷ .......................... H01L 23/58; H01L 21/66
(52) U.S. Cl. ........................................... 257/48; 438/18
(58) Field of Search .............................. 257/48; 438/11, 438/16, 17, 18

(56) References Cited

U.S. PATENT DOCUMENTS

| | | | |
|---|---|---|---|
| 3,751,647 A | | 8/1973 | Maeder et al. |
| 3,842,491 A | | 10/1974 | Depuy et al. |
| 3,983,479 A | | 9/1976 | Lee et al. |
| 4,413,271 A | * | 11/1983 | Gontowski, Jr. et al. ..... 357/40 |
| 4,835,466 A | * | 5/1989 | Maly et al. ............. 324/158 R |
| 4,855,253 A | | 8/1989 | Weber |
| 4,992,392 A | * | 2/1991 | Nichols ....................... 437/53 |
| 5,159,752 A | | 11/1992 | Mahant-Shetti et al. |
| 5,485,095 A | * | 1/1996 | Bertsch et al. .............. 324/537 |
| 5,514,974 A | | 5/1996 | Bouldin |
| 5,576,223 A | | 11/1996 | Zeininger et al. |
| 5,670,891 A | * | 9/1997 | Ling et al. ................... 324/765 |
| 5,723,874 A | * | 3/1998 | Baker et al. ................... 257/48 |
| 5,773,315 A | | 6/1998 | Jarvis |
| 5,952,674 A | * | 9/1999 | Edelstein et al. ............. 257/48 |
| 5,956,566 A | * | 9/1999 | Lin et al. ...................... 438/17 |
| 5,959,459 A | | 9/1999 | Satya et al. |
| 5,982,042 A | * | 11/1999 | Nakamura .................. 257/786 |

OTHER PUBLICATIONS

Merriam–Webster's Collegiate Dictionary, 10th ed. 1998, p. 657.*
Chen et al. "Self–aligned intverse T–gate LDD devices for sub–hald micron CMOS technology", IEEE, Elecron Devices Meeting, pp. 829–832, Dec. 1990.*
Ronkainen "The use of disposable double spacer and self–aligned cobalt silicide for LDD MOSFET fabrication" IEEE, Electron Device Letters, vol. 12(3), pp. 125–127, Mar. 1991.*
S. Wolf, Silicon Processing for the VLSI Era, vol. 2: Process Integration, Lattice Press: Sunset Beach, pp. 354–358, 1990.*
J. Vossen and W. Kern, Thin Film Processes, Academic Press: San Diego, pp. 417–418, 1978.*

(List continued on next page.)

Primary Examiner—Olik Chaudhuri
Assistant Examiner—Erik Kielin
(74) Attorney, Agent, or Firm—Kevin L. Daffer; Conley, Rose & Tayon P.C.

(57) ABSTRACT

A test structure for characterizing ion implantation procedures used in integrated circuit fabrication processes and a method for using the test structure are described. The test structure includes a first dielectric layer, a patterned polysilicon layer, and a second dielectric layer arranged in order upon a substrate. Ion implantation of the second dielectric layer may be performed according to a procedure used in the fabrication of integrated circuits. The ion-implanted regions of the second dielectric layer may be preferentially removed relative to non-ion-implanted regions of the second dielectric layer. A metal silicide may then be selectively formed upon portions of the patterned polysilicon not covered by non-removed regions of the second dielectric layer. Electrical testing and/or optical inspection may be used to identify defects introduced into the test structure during ion implantation.

8 Claims, 4 Drawing Sheets

OTHER PUBLICATIONS

Hess et al., "Modeling of Real Defect Outlines for Defect Size Distribution and Yield Prediction," *Proc. IEEE 1993 Int. Conference on Microelectronic Test Structures*, vol. 6, Mar. 1993.

Hess et al., "Drop In Process Control Checkerboard Test Structure for Efficient Online Process Characterization and Defect Problem Debugging," *Proc. IEEE 1994 Int. Conference on Microelectronic Test Structures*, vol. 7, Mar. 1994.

Hess et al., "Modeling of Test Structures for Efficient Online Defect Monitoring Using a Digital Tester," *Proc. IEEE 1994 Int. Conference on Microelectronic Test Structures*, vol. 7, Mar. 1994.

Hess, "Strategy of Optimize the Development, Use, and Dimension of Test Structures to Control Defect Appearance in Backend Process Steps," *Proc. IEEE/SEMI 1994 Advanced Semiconductor Manufacturing Conference*, vol. 5, Nov. 1994.

Hess et al., "Defect Parameter Extraction in Backend Process Steps Using a Multilayer Checkerboard Test Structure," *Proc. IEEE 1995 Int. Conference on Microelectronic Test Structures*, vol. 8, Mar. 1995.

Hess et al., "Influence of Short Circuits on Data of Contact & Via Open Circuits Determined by a Novel Weave Test Structure," *Proc. IEEE 1995 Int. Conference on Microelectronic Test Structures*, vol. 8, Mar. 1995.

Hess et al., "Resistance Modeling of Test Structures for Accurate Fault Detection in Backend Process Steps Using a Digital Tester," *Proc. IEEE 1995 Int. Conference on Microelectronic Test Structures*, vol. 8, Mar. 1995.

Hess et al., "A Digital Tester Based Measurement Methodology for Process Control in Multilevel Metallization Systems," *Proc. SPIE's 1995 Microelectronic Manufacturing Conference*, vol. 2637, Oct. 1995.

Hess et al., "Control of Application Specific Interconnection on Gate Arrays Using an Active Checkerboard Test Structure," *Proc. IEEE 1996 Int. Conference on Microelectronic Test Structures*, vol. 9, Mar. 1996.

Hess et al., "Correlation Between Particle Defect and Electrical Faults Determined with Laser Scattering Systems and Digital Measurements on Checkerboard Test Structures," *Proc. SPIE's 1996 Microelectronic Manufacturing Conference*, vol. 2874, Oct. 1996.

Hess et al., "Issues on the Size and Outline of Killer Defects and their Influence on Yield Modeling," *Proc. IEEE/SEMI 1996 Advanced Semiconductor Manufacturing Conference*, vol. 7, Nov. 1996.

Hess et al., "Determination of Defect Size Distributions Based on Electrical Measurements at a Novel Harp Test Structure," *Proc. IEEE 1997 Int. Conference on Microelectronic Test Structures*, vol. 10, Mar. 1997.

Hess et al., "Issues on Short Circuits in Large On–Chip Power MOS–Transistors Using a Modified Checkerboard Test Structure," *Proc. IEEE 1997 Int. Conference on Microelectronic Test Structures*, vol. 10, Mar. 1997.

Hess et al., "Customized Checkerboard Test Structures to Localize Interconnection Point Defects," *Proc. 1997 VLSI Multilevel Interconnection Conference*, vol. 14, Jun. 1997.

Hess et al., "Comparison of Defect Size Distributions Based on Electrical and Optical Measurement Procedures," *Proc. IEEE/SEMI 1997 Advanced Semiconductor Manufacturing Conference*, vol. 8, Sep. 1997.

Hess et al., "Defect Cluster Analysis to Detect Equipment Specific Yield Loss Based on Yield–to–Area Calculations," *Proc. SPIE's 1997 Microelectronic Manufacturing Conference*, vol. 3216, Oct. 1997.

Hess et al., "Strategy to Disentangle Multiple Faults to Identify Random Defects within Test Structures," *Proc. IEEE 1998 Int. Conference on Microelectronic Test Structures*, vol. 11, Mar. 1998.

Hess et al., "Wafer Level Defect Density Distribution Using Checkerboard Test Structures," *Proc. IEEE 1998 Int. Conference on Microelectronic Test Structures*, vol. 11, Mar. 1998.

Hess et al., "Novel Methodology to Include all Measured Extension Values per Detect to Improve Defect Size Distributions," *Proc. IEEE/SEMI 1998 Advanced Semiconductor Manufacturing Conference*, vol. 8, Sep. 1998.

* cited by examiner

TEST STRUCTURE AND METHODOLOGY FOR CHARACTERIZING ION IMPLANTATION IN AN INTEGRATED CIRCUIT FABRICATION PROCESS

BACKGROUND OF THE INVENTION

1. Field of the Invention

This invention relates to integrated circuit fabrication and, more particularly, to a test structure for characterizing integrated circuit ion implantation processes.

2. Description of the Related Art

High yields are essential to the profitable manufacture of integrated circuits. Inspection technologies that detect fatal manufacturing defects immediately after critical processing is accordingly a very valuable tool in assuring that such manufacture will be economically successful.

A wafer fabrication process typically forms multiple integrated circuits upon each of several silicon wafers processed simultaneously. As the integrated circuits formed on a given silicon wafer are identical copies of a given product, the silicon wafer is sometimes referred to as a product wafer. An individual integrated circuit is also called a "chip" or a "die". Following wafer fabrication, the die are subjected to functional testing, then separated. Fully functional die are typically packaged and sold as individual units.

In general, the yield associated with a product wafer manufactured using a particular wafer fabrication process depends upon: 1) the number of steps in the wafer fabrication process, 2) the number of defects introduced during each processing step, and 3) the vulnerability of the features formed during a given processing step to the defects introduced during the processing step. Semiconductor chip manufacturing has many sources of defects that impact yield. As used herein chip yield is the measure of total available die minus those lost to systematic (process technology) defects and those lost to random (tool and environmental) defects. A defect is simply a flaw caused by an imperfect manufacturing process. Only some of the defects associated with a given step are "critical" defects, or defects which prevent an integrated circuit containing the defect from performing its intended function. Random defects are of primary concern to many manufacturers of semiconductor devices. Within the category of random defects, two types of defects may occur, visual defects and non-visual defects. Visual defects may be detected during manufacturing with optical and laser based methods. In many cases, if proper electrically sensitive circuits are created, they may also be found with electrical testing. When found they may be identified and corrective actions are typically taken to reduce or eliminate the defects.

Non-visual defects, on the other hand, may be difficult to identify during manufacturing by visual inspection technology (optical or laser). In addition, many non-visual defects may occur during processing steps which do not directly lead to conductive features, making them difficult to identify by electrical testing. One of the most common sources of non-visual defects is the presence of particles on the wafer during ion implantation.

During a typical ion implantation sequence, a photoresist layer is placed over a semiconductor substrate and patterned such that only the areas which are to be implanted are exposed. After patterning of the photoresist is completed, the wafer typically goes into an ion implantation apparatus. The ion implantation apparatus will implant ions into the semiconductor substrate, as depicted in FIG. 1. Typically, individual transistor gate structures 100 may mask portions of the semiconductor substrate 120 such that the ions are hindered from entering the channel region 130 of the transistor. The ion implantation may be used to form source and drain regions 150 in the semiconductor substrate.

During the transfer of the wafer to the ion implantation apparatus, and while the wafer resides in the ion implantation apparatus, particles may be introduced onto the surface of the wafer. Particles may be present in the ambient air, introduced by processing personnel, suspended in liquids and gases used during processing, or generated by processing equipment. In general, the vulnerability of a particular feature to a given defect is inversely proportional to the physical dimensions of the feature. Thus the smaller the physical dimensions of a feature being formed, the greater the likelihood that a particle of a given size will cause a critical defect. Referring to FIG. 2, these particles 160 may block or hinder implantation into portions 170 of the semiconductor substrate 120. After ion implantation is completed, the wafer is typically subjected to a photoresist strip. During this photoresist strip, any defects which may have been on the upper surface of the wafer will be removed. This process may lead to optically invisible areas in which there is no implant. Additionally, impacts of highly accelerated particles can loosen and break portions of the patterned photoresist. Since the photoresist layer is later removed, these non-visible defects may also be present.

It would therefore be beneficial to develop a method for characterizing the ion implantation procedures and equipment used in integrated circuit fabrication. In particular, it would be advantageous to have the capacity to test for implant shielding due to the presence of particulate contamination. Accurate information on possible particulate contamination would be useful in minimizing or eliminating implant-related defects in integrated circuits fabricated using the processes being tested and supportive the Yield Prediction estimating methodologies.

SUMMARY OF THE INVENTION

The problems outlined above may be solved by a test structure, and the technique for forming and using the test structure, for characterizing defects produced during an ion implantation processes. A layer of a material which may be rendered etch selective depending on the presence or absence of implanted atoms is deposited upon a conductive layer. The etch selective material may, in one embodiment, be rendered etch selective by implanting atoms into the material. The faster etching portions of the etch selective material may be removed, leaving portions of the etch selective material behind. The position of these remaining portions of the etch selective material may be used to approximately determine the location of the defect.

In one embodiment, the process involves the formation of a dielectric material upon a semiconductor substrate. The dielectric material is subjected to an ion implantation process. The ion implantation typically causes the etch rate of the dielectric material to change. In one embodiment, the etch rate of the dielectric material increases when subjected to an ion implantation process. Any particles which are present on the test structure, however, may partially or completely block the ion implantation into the dielectric material, causing portions of the dielectric material to have different etch rates. After ion implantation, the dielectric material is removed. The ion implanted portions of the dielectric layer undergo, in one embodiment, rapid removal, while the partially or completely blocked portions of the dielectric layer are removed more slowly. The etch rate may then be controlled such that only the ion implanted portions of the dielectric material are removed. This leaves portions of dielectric material on the test structure proximate the position of particles which were present during the ion implantation. In this manner, the non-visual defects produced during an ion implantation may be more readily identified.

In an embodiment, a test structure is formed upon a semiconductor substrate. A first dielectric layer is formed upon the upper surface of the semiconductor substrate. A polysilicon layer is then formed upon the first dielectric layer. The polysilicon layer may be patterned into a meandering line which covers a portion of the semiconductor substrate. After pattering of the polysilicon layer, a second dielectric layer is formed upon the polysilicon layer and the first dielectric layer.

The second dielectric layer may be subjected to an ion implantation process. When silicon dioxide or silicon nitride are used as the second dielectric material, the ion implantation process may damage the second dielectric material. This damage causes the etch rate of the ion implanted second dielectric layer to etch faster than unimplanted areas. The presence of particles on the second dielectric layer may inhibit implantation of the ions into the second dielectric layer. After the ion implantation process is completed, the dielectric layer may be removed using a dry etch (e.g., a plasma etch) or wet etch. The etch is timed to remove all of the ion implanted dielectric material, while leaving behind a portion of the non-ion implanted dielectric material. In one embodiment, the resulting structure may undergo a visual inspection to determine the location, size and frequency of particles introduced during the ion implantation process.

In order to perform electrical testing of the ion implantation process, the polysilicon layer may be rendered conductive by forming a silicide upon the upper surface of the polysilicon layer. In one embodiment, a refractory metal is deposited upon the polysilicon layer after the differential etch of the second dielectric layer is performed. The unetched portions of the second dielectric layer may prevent the refractory metal from being deposited upon the polysilicon layer. The refractory metal is subjected to an anneal process. The portions of the polysilicon layer which are in contact with the refractory metal diffuse into the metal layer to form a silicide layer upon the upper surface of the polysilicon. The portions of the polysilicon layer that are blocked by the second dielectric layer will be inhibited from forming a silicide. The first dielectric layer prevents the formation of silicide in the underlying semiconductor substrate. After the anneal process is completed, any remaining unreacted refractory metal may be removed. Electrical testing of the test structure may now be performed, since the conductivity of the polysilicon line has been enhanced by formation of the silicide. The continuity of the silicide layer may be broken by the non-silicided portions of the polysilicon line. Thus, electrical testing may be used to determine if the particle present in the ion implantation process will cause critical defects in the final product.

BRIEF DESCRIPTION OF THE DRAWINGS

Other objects and advantages of the invention will become apparent upon reading the following detailed description and upon reference to the accompanying drawings in which.

Figure 1:
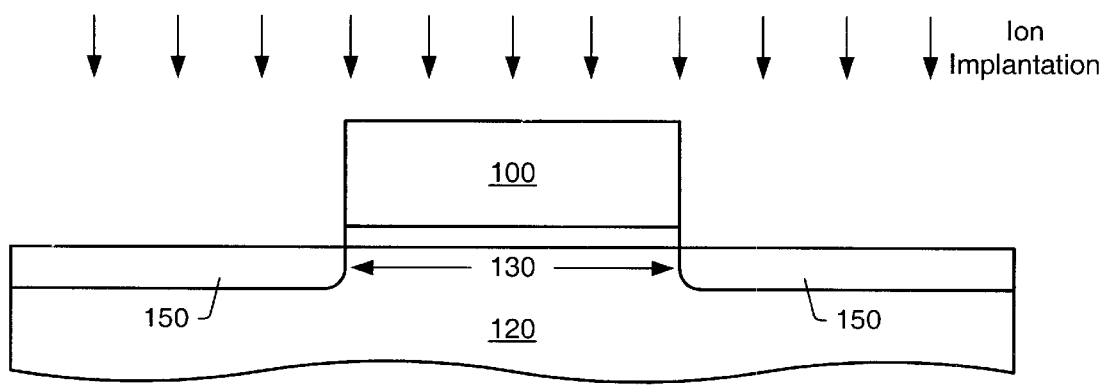
FIG. 1 depicts a cross-sectional view of a portion of an integrated circuit topography during ion implantation.
Figure 2:
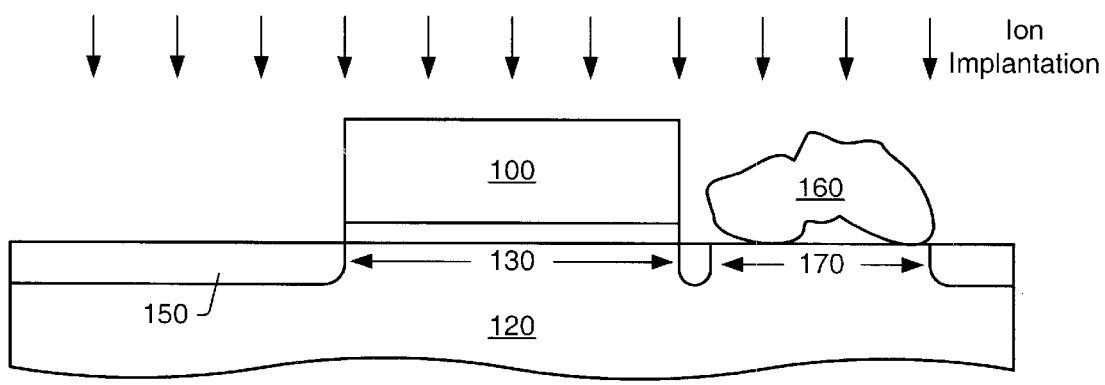
FIG. 2 depicts a cross-sectional view of an integrated circuit topography during ion implantation, in which particulate contamination is present.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Figure 3:
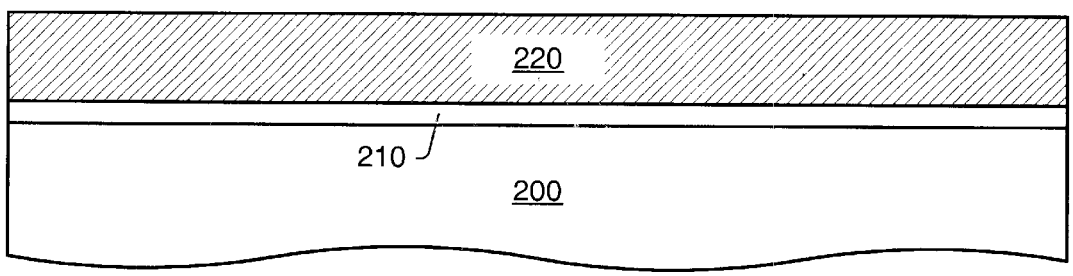
FIG. 3 depicts a cross-sectional view of a test structure substrate on which a first dielectric layer and a polysilicon layer have been formed.

Turning now to the drawings, FIG. 3 depicts a cross-sectional view of a substrate 200 upon which a first dielectric layer 210 is formed. First dielectric layer 210 may include silicon dioxide deposited or grown upon the semiconductor substrate. The silicon dioxide may be deposited by, e.g., reaction of dichlorosilane and nitrous oxide or by decomposition of tetraethyl orthosilicate. Preferably, first dielectric layer 210 is deposited to a thickness substantially between about 500 angstroms and about 1500 angstroms. According to an embodiment, first dielectric layer 210 has a thickness of about 1000 angstroms. A polysilicon layer 220 may then be deposited upon first dielectric layer 210, by, e.g., chemical-vapor deposition from a silane-containing source. Preferably, polysilicon layer 220 is deposited to a thickness between about 1500 angstroms and about 2500 angstroms. According to an embodiment, polysilicon layer 220 has a thickness of about 2000 angstroms.

Figure 4:
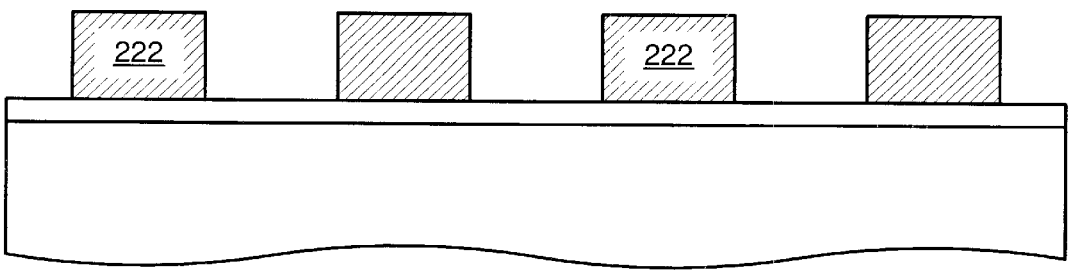
FIG. 4 depicts a cross-sectional view of the test structure after patterning of the polysilicon layer.
Figure 5:
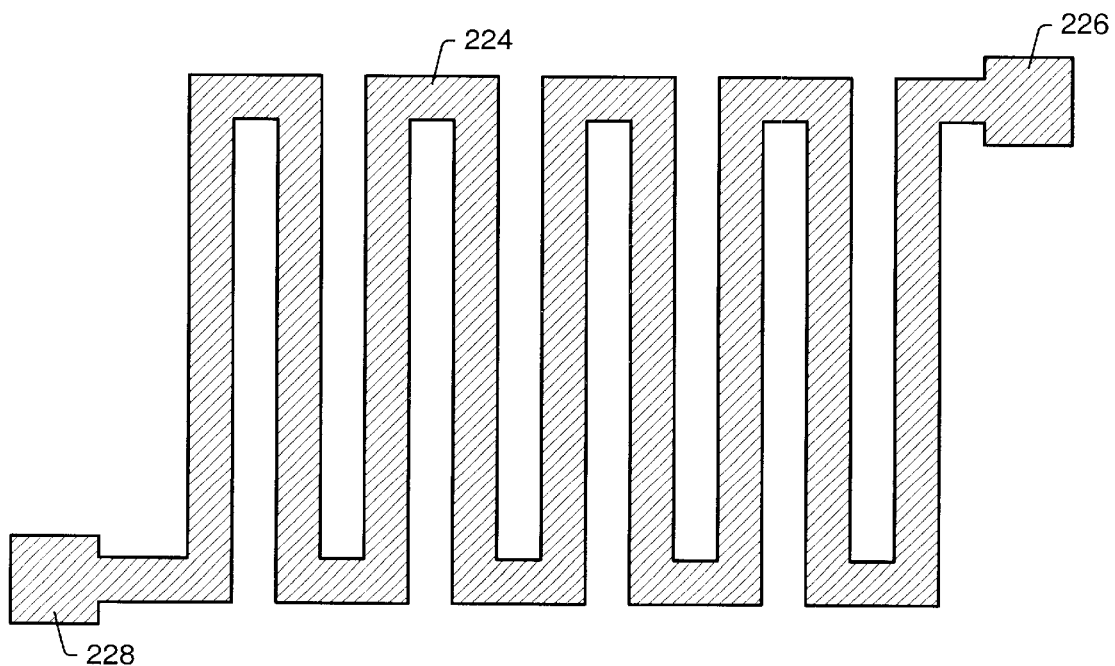
FIG. 5 depicts an overhead view of a meandering polysilicon line.

As shown in FIG. 4, polysilicon layer 220 may be patterned using well-known photolithographic processes to form polysilicon portions 222. The polysilicon layer may be patterned into a test structure, as depicted in FIG. 5. The test structure includes a meandering polysilicon line 224 with test pads 226 and 228 formed at both ends of the line. This type of test structure may be used for determining the presence of partial or complete breaks in the subsequently formed silicide layer. If no defects are present, electrical probing of pads 226 and 228, after silicide formation, should show conductivity between the two pads. If, however, a defect is present along the silicided polysilicon, an increase in the resistance of the conductive line 224 between the two pads 226 and 228 may be observed. The polysilicon line may be patterned such that a width of the polysilicon line is comparable to the minimum width of implanted regions of a production wafer.

Figure 6:
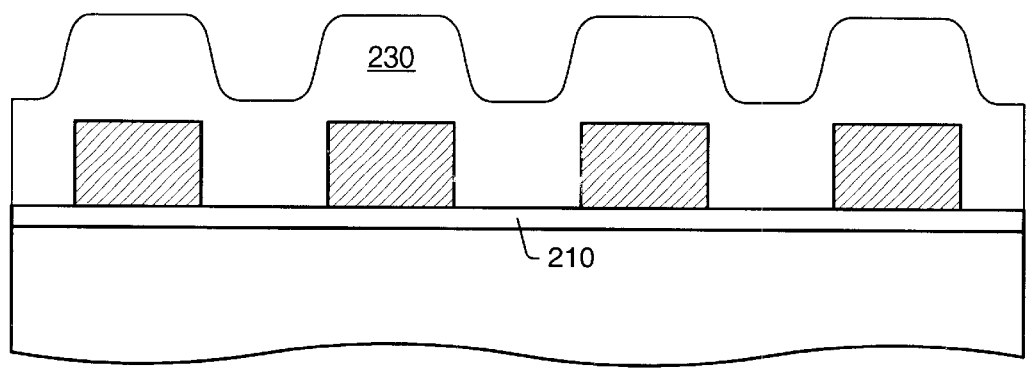
FIG. 6 depicts a cross-sectional view of the test structure after forming a second dielectric layer upon the first dielectric layer and the polysilicon.

After patterning the polysilicon layer, a second dielectric layer 230 may be deposited upon polysilicon portions 222 and first dielectric layer 210, as shown in FIG. 6. Second dielectric layer 230 may include silicon dioxide deposited by, e.g., reaction of dichlorosilane and nitrous oxide or by decomposition of tetraethyl orthosilicate. Alternatively, second dielectric layer 230 may include silicon nitride. Preferably, second dielectric layer 230 is deposited to a thickness substantially between about 500 angstroms and about 1000 angstroms.

Figure 7:
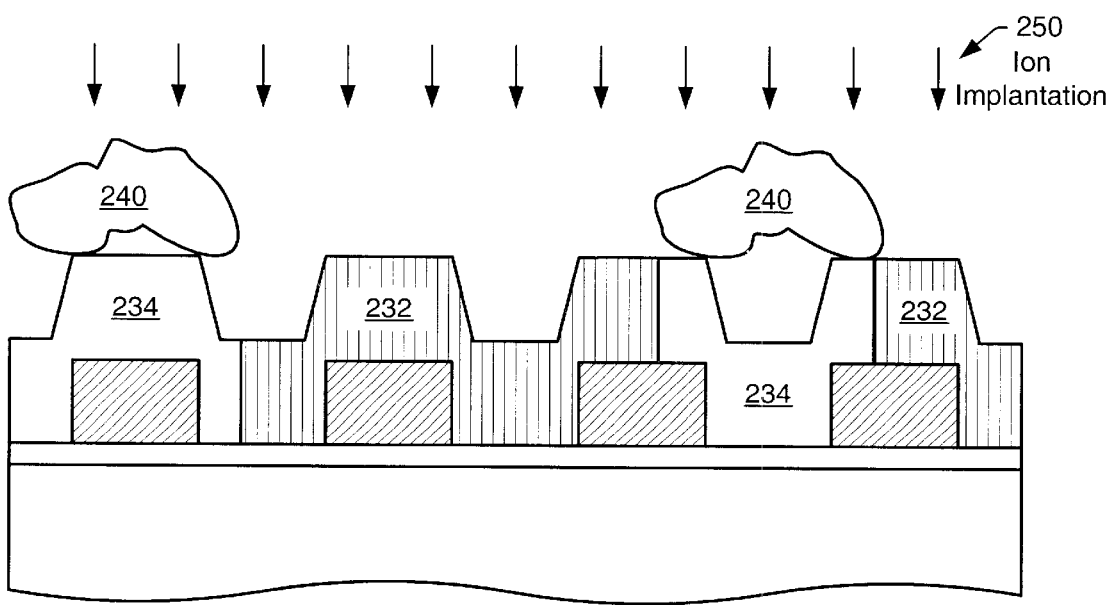
FIG. 7 depicts a cross-sectional view of the test structure during ion implantation, in which particulate contamination is present.

Turning now to FIG. 7, particles 240 may be deposited upon an upper surface of second dielectric 230 during processing. As depicted in FIG. 7, particles 240 may be deposited over portions of the polysilicon line 222. In some cases, the particles 240 may completely cover a portion of the polysilicon line 222. Particles 240 may be present in the ambient air, introduced by processing personnel, suspended in liquids and gases used during processing, or generated by processing equipment.

Ions 250 may be implanted into second dielectric layer according to methods that are well known in the art. In one embodiment, ions 250 are phosphorous ions. According to an embodiment, phosphorous ions 250 are implanted into second dielectric layer at a concentration and an energy which are equivalent to the processing conditions used during the production of integrated circuits. During implantation, phosphorous will be introduced into the second dielectric layer 230 forming doped regions 232. Undoped regions 234 of second dielectric layer 230, however, will be masked by particles 240. As such, undoped regions 234 may be substantially free of phosphorous. Phosphorous ions are preferred for the ion implant because introducing phosphorous into the dielectric material increases the etch rate of doped regions relative to undoped regions.

According to an alternative embodiment, phosphorous may be introduced into a first plurality of test structures at a high concentration and low energy as described above. Phosphorous may then be introduced into a second plurality of test structures at a high concentration and a high energy in order to determine the nature of the particulate contamination. For example, a high-energy implant may be able to penetrate relatively thin flakes of a material such as silicon, such that phosphorous implant dopes the regions of the dielectric layer underlying the particles. Implantation through thicker and denser metal particulates, on the other hand, may be blocked even at the higher energies. Comparison of test structures doped according to the high-energy and the low-energy regimes may provide information on the nature of the contamination present upon the wafer.

Figure 8:
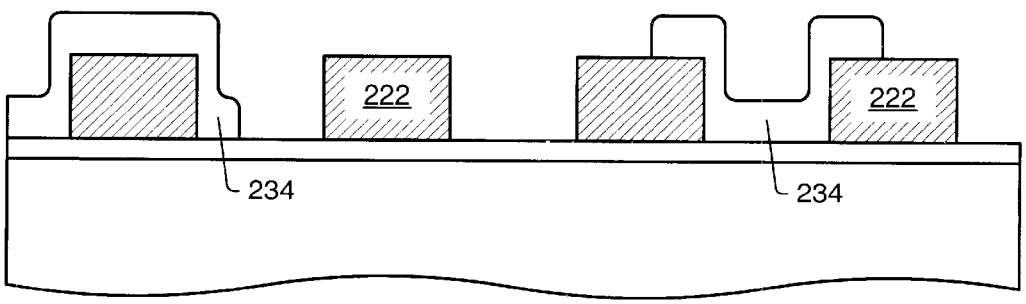
FIG. 8 depicts a cross-sectional view of the test structure after removal of ion-implanted portions of the second dielectric layer.

The doped test structure may then be etched using a plasma etch or a wet etch selective for second dielectric layer 230 material, as depicted in FIG. 8. The etching time is performed for a time period required to remove substantially all of the doped regions 232 of the second dielectric layer 230. Thus, if the thickness of the dielectric material is 400 angstroms, the etch time is adjusted to a time that will allow 400 angstroms of doped dielectric material to be substantially removed. A portion of the undoped regions 234 of the second dielectric layer 230 will be retained at sites on the test structure that were masked by particles 240.

After the second dielectric layer is etched, the test structure may be visually inspected to determine if any particles were present during the implantation process. In one embodiment, the test structures are scanned using an image-to-image comparator (such as one of the KLA-2100 series available from KLA-Tencor, San Jose, Calif.). The image-to-image comparator includes a sophisticated image-processing computer that compares pixels at identical locations in images of adjacent die sites on a wafer. Each pixel is assigned a gray-scale value, and three points are compared before a location is flagged as defective. That is, identical sites on a first die and a second die are compared for gray-scale values. The same sites on the second die and a third die are then compared. If any of the pixel values for the first, second, and third die sites differ, then an event is logged. The three-point evaluation then continues for the entire scanned distance across the wafer, in both forward and reverse directions. In this way, defect sites (i.e., sites at which undoped dielectric material has been retained) can be identified based on their gray-scale values, and problems with ion implantation can be identified. This automated inspection method covers much more wafer area than the manual inspection method, therefore improving the possible capture of defects.

Figure 9:
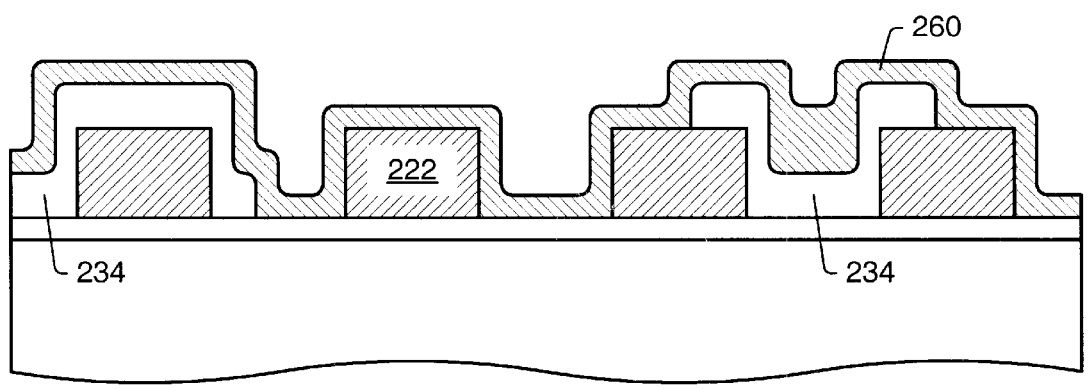
FIG. 9 depicts a cross-sectional view of the test structure after forming a metal layer upon the patterned polysilicon layer, the first dielectric layer, and retained portions of the second dielectric layer.
Figure 10:
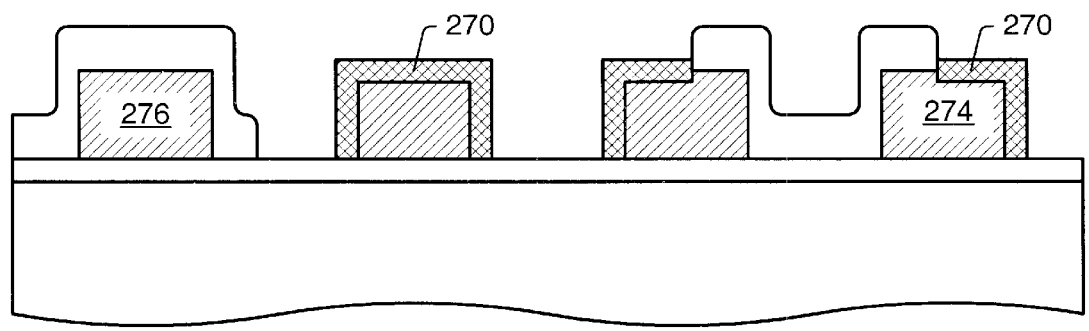
FIG. 10 depicts a cross-sectional view of the test structure after forming a metal silicide upon portions of the patterned polysilicon layer.

Additionally, the test structure may be further modified to allow electrical and enhanced visual identification of the defects. In one embodiment, a silicide layer may be formed upon the exposed polysilicon lines. In a silicide process, a metal film 260 is blanket-deposited over the exposed surfaces of the polysilicon lines 222 and the remaining portions of the dielectric material 234, as depicted in FIG. 9. The test structure is then subjected to a heating process which causes a reaction between the metal and the portion of the polysilicon lines that the metal is in contact with, forming a silicide on the polysilicon surfaces. Unreacted metal is then removed, leaving a silicide 270 covering the upper surface of the exposed surface of the polysilicon line 222, as depicted in FIG. 10. Conditions for forming silicide layers are well known in the art. Refractory metals which may be used to form silicides include, but are not limited to, titanium, tantalum, molybdenum, cobalt, and platinum.

After the silicided test structure is formed, visual and electrical testing may be performed. An electrical test may include testing the conductivity of the silicided polysilicon lines. An electrical probe may be placed between two or more pads coupled to the polysilicon line. An increase in resistance along a defective silicided polysilicon line between the testing pads, compared to a non-defective silicided polysilicon line, may signal the presence of a partially silicided line 274, as depicted in FIG. 10. Typically, the partially silicided or non-silicided portions of the polysilicon line will have a resistance 1 to 2 orders of magnitude above that of the silicided polysilicon line. A further increase in resistance along a silicided line may signal the presence of an non-silicided portion 276 of the polysilicon line 222. The polysilicon line may also be visually inspected using an automated inspection tool as described above. The high contrast between the silicided polysilicon line and the remaining dielectric portions may enhance the identification of defects.

It will be appreciated to those skilled in the art having the benefit of this disclosure that this invention is believed to provide a test structure for characterizing implantation methodology and a method for fabricating the test structure. It will be further appreciated to those skilled in the art having the benefit of this disclosure that this invention is believed to provide a method for using the test structure to characterize the implantation methodology. Further modifications and alternative embodiments of various aspects of the invention will be apparent to those skilled in the art in view of this description. It is intended that the following claims be interpreted to embrace all such modifications and changes and, accordingly, the specification and drawings are to be regarded in an illustrative rather than a restrictive sense.

What is claimed is:

1. A test structure, comprising:

a conductive layer residing upon a dielectric layer;

a layer of material rendered etch selective depending on the presence or absence of implanted atoms therein, wherein the etch selective material residing on a localized region of the conductive layer has a relatively slow etch rate; and a metal silicide residing upon an upper surface and sidewall surfaces of the conductive layer in regions not covered by the etch selective material.

2. The test structure of claim 1, wherein the implanted atoms are phosphorus.

3. The test structure of claim 1, wherein the conductive layer is polysilicon.

4. The test structure of claim 1, wherein the conductive layer comprises a patterned polysilicon layer.

5. The test structure of claim 4, wherein the patterned polysilicon layer is a meandering line.

6. The test structure of claim 1, wherein the etch selective material is silicon dioxide.

7. The test structure of claim 1, wherein the etch selective material is silicon nitride.

8. The test structure of claim 1, wherein the etch selective material has a thickness greater than about 500 angstroms.

* * * * *